(12) United States Patent
Kawai

(10) Patent No.: US 7,963,451 B2
(45) Date of Patent: Jun. 21, 2011

(54) ANTENNA UNIT AND NONCONTACT IC TAG

(75) Inventor: Wakahiro Kawai, Kyoto (JP)

(73) Assignee: Omron Corporation, Kyoto (JP)

( * ) Notice: Subject to any disclaimer, the term of this patent is extended or adjusted under 35 U.S.C. 154(b) by 1334 days.

(21) Appl. No.: 11/501,825

(22) Filed: Aug. 10, 2006

(65) Prior Publication Data

US 2007/0069037 A1     Mar. 29, 2007

(30) Foreign Application Priority Data

Sep. 29, 2005   (JP) .................................. 2005-283676

(51) Int. Cl.
    *G06K 19/06*       (2006.01)
(52) U.S. Cl. ...................................................... 235/492
(58) Field of Classification Search ................... 235/492
    See application file for complete search history.

(56) References Cited

U.S. PATENT DOCUMENTS

| 7,336,243 B2 * | 2/2008 | Jo et al. ......................... 343/895 |
| 2002/0003496 A1 | 1/2002 | Brady et al. |
| 2003/0112192 A1 * | 6/2003 | King et al. ..................... 343/718 |

FOREIGN PATENT DOCUMENTS

| JP | 2005-204179 | | 7/2005 |
| JP | 2005-259153 | A | 9/2005 |
| TW | 580640 | B | 3/2004 |

* cited by examiner

*Primary Examiner* — Jamara A Franklin
(74) *Attorney, Agent, or Firm* — Dickstein Shapiro LLP

(57) ABSTRACT

An antenna unit by which a noncontact IC tag having different resonance frequencies can be easily manufactured, and the noncontact IC tag are provided. An antenna unit has an impedance matching wiring portion and an antenna, in which when an IC chip is electrically connected to the impedance matching wiring portion and the antenna, a noncontact IC tag is formed; wherein connectable regions are provided in the impedance matching wiring portion, the regions making a direct or indirect connecting position of the IC chip to be adjustable within a predetermined range, so that effective partial length for impedance matching is made adjustable.

12 Claims, 7 Drawing Sheets

1 ... RFID TAG
2 ... ANTENNA CIRCUIT BOARD
4 ... ANTENNA
6 ... IMPEDANCE MATCHING WIRING PORTION
11 ... IC CHIP

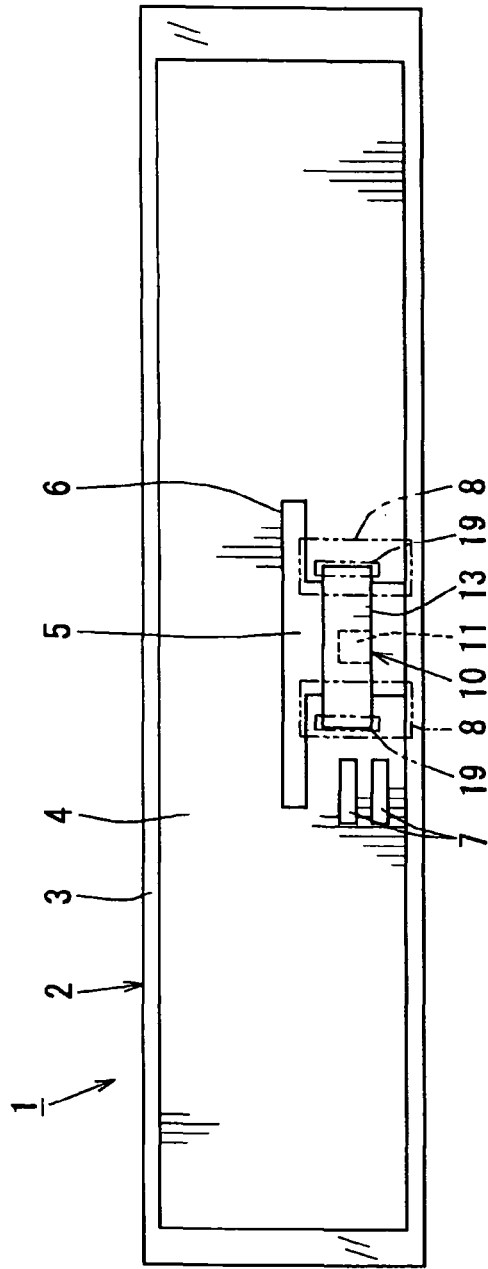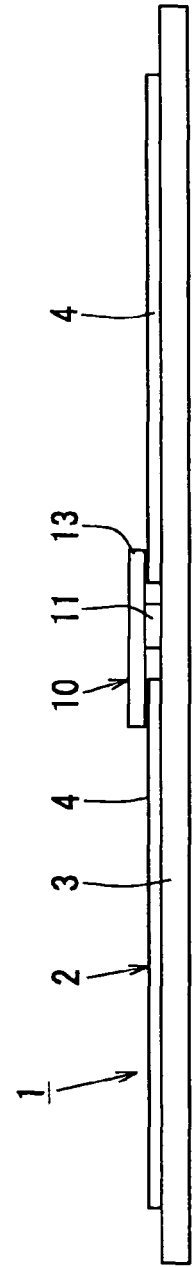
Fig. 1A
Fig. 1B
1 .... RFID TAG
2 .... ANTENNA CIRCUIT BOARD
4 .... ANTENNA
6 .... IMPEDANCE MATCHING WIRING PORTION
11 .... IC CHIP

11 ... IC CHIP

4 ... ANTENNA

6 ... IMPEDANCE MATCHING WIRING PORTION

6 ... IMPEDANCE MATCHING WIRING PORTION    11 ... IC CHIP
7 ... MARKER PORTION    W ... EFFECTIVE PARTIAL LENGTH
8 ... CONNECTING REGION

Fig. 5

| POSITION | R(Ω) | X(Ω) | GAIN | MATCHING LOSS | Gain−M | CORRESPONDING FREQUENCY |
|---|---|---|---|---|---|---|
| (A) | 2.369 | 102.7 | 2.34 | 0.91 | 1.43 | 953MHz |
| (B) | 2.077 | 112.1 | 2.20 | 4.73 | −2.52 | 915MHz |
| (C) | 1.302 | 99.94 | 1.92 | 3.02 | −1.11 | 850MHz |

4 ... ANTENNA
6 ... IMPEDANCE MATCHING WIRING PORTION
7 ... MARKER PORTION
8 ... CONNECTING REGION
11 ... IC CHIP
W ... EFFECTIVE PARTIAL LENGTH

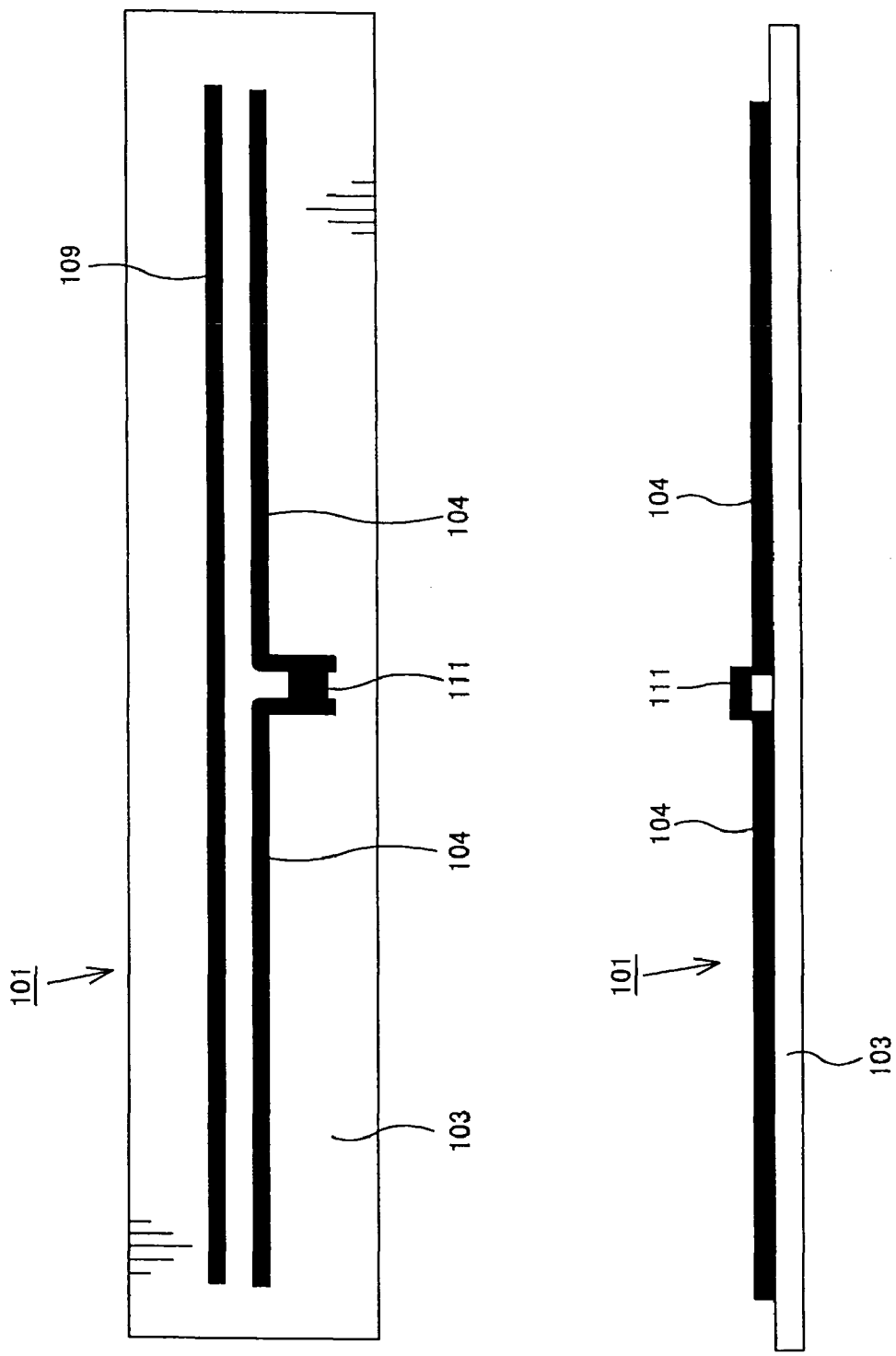

ANTENNA UNIT AND NONCONTACT IC TAG

CROSS-REFERENCE TO RELATED APPLICATIONS

This application claims priority under 35 USC 119 to Japanese Patent Application No. 2005-283676, dated Sep. 29, 2005, which is incorporated herein by reference.

BACKGROUND OF THE INVENTION

1. Field of the Invention

The present invention relates to a noncontact IC tag for communication in a noncontact manner using, for example, an electromagnetic wave in a UHF band, and an antenna unit used for the noncontact IC tag.

2. Description of Related Art

Automation has been introduced in various fields by using machines. For example, when automation is tried to be introduced in physical distribution, it is essential that contents of a slip attached to an individual article are machine-readable. As a method of realizing such automation, a barcode label corresponding to contents of an individual slip has been attached to the slip.

However, to read the barcode label using a so-called barcode reader, a distance between the barcode reader and the barcode label needs to be accurately connected with a direction of the barcode reader directed to the barcode label. Since the connection between the distance and the direction is manually established, much time is taken for read operation, which has obstructed facilitation of the physical distribution. Furthermore, since only a small amount of information can be inputted into the barcode, a region that can be controlled by using the barcode label has been limited to only a narrow region.

From such background, a noncontact IC tag readable in a noncontact manner using an induction field is currently noted. In the noncontact IC tag, since it communicates in the noncontact manner using the induction field, considerably few restrictions are given on establishing the connection between the distance and the direction in reading stored data compared with the barcode, consequently read operation can be efficiently performed.

Moreover, IC in the noncontact IC tag can store individual information of an article as a control object in high capacity. Therefore, an application range is expanded, and for example, the individual information can be used as security information for specifying an individual.

However, types of application using the noncontact IC tag are now increased, and a type of application appears, for which a read distance (about 50 cm) by the induction field is insufficient. As an approach to solve a difficulty on the read distance, a method is begun to be examined, in which a read distance of 3 to 5 m is obtained by using an electromagnetic wave in the UHF band (850 to 950 MHz) or the like, (JP-A-2004-80600).

FIGS. 7A to 7B show an example of a noncontact IC tag 101 used in the frequency band of UHF, wherein FIG. 7A shows a plane view, and FIG. 7B shows a front view. The noncontact IC tag 101 is configured by an IC chip 111 having a memory function therein, and an antenna 104 provided on a film 103.

Typically, in the noncontact IC tag 101 used in the frequency band, to increase the read distance, it is necessary that impedance of the IC chip 111 is allowed to match impedance of the antenna 104, the chip and antenna configuring the noncontact IC tag 101, in order to maximize power transmitted and received between the noncontact IC tag 101 and a lead antenna.

Therefore, for example, the impedance of the antenna 104 having a shape adapted for a frequency value to be used is allowed to match the impedance of the IC chip 111 determined by an internal component circuit by providing a loading bar 109 parallel to the antenna 104.

However, in use of the frequency of the UHF band, a frequency band that can be used by a noncontact IC tag system is established in various countries to prevent interference with other wireless devices such as a mobile phone. The frequency band is different for each country, such as 948 to 956 MHz in Japan, 902 to 928 MHz in the United States, 865 to 868 MHz in Europe, and 918 to 925 MHz in China. Therefore, manufacturers that produce and sell the noncontact IC tag are necessary to design the antenna 104 to be adapted for the frequency in each of the countries, and consequently a difficulty has been given, that is, production or control of the noncontact IC tag 101 becomes extremely complicated.

SUMMARY OF THE INVENTION

It is desirable to provide an antenna unit by which a noncontact IC tag having different resonance frequencies can be easily manufactured in a noncontact IC tag that can communicate through an electromagnetic wave using the UHF band (for example, 850 to 960 MHz) as communication frequency, and provide the noncontact IC tag.

In an embodiment of the invention, an antenna unit has an antenna and an impedance matching wiring portion, in which when an IC chip is electrically connected to the antenna and the impedance matching wiring portion, a noncontact IC tag is formed; wherein connectable regions are provided in the impedance matching wiring portion, the regions making a direct or indirect connecting position of the IC chip to be adjustable within a predetermined range, so that effective partial length for impedance matching is made adjustable.

As an aspect of the embodiment of the invention, the connectable regions are two ends of the impedance matching wiring portion, and the two ends can be arranged approximately parallel to each other.

As another aspect of the embodiment of the invention, the antenna can be formed in a shape extending in an approximately perpendicular direction to the two ends parallel to each other.

As still another aspect of the embodiment of the invention, identification portions for identifying difference in performance due to the connecting positions of the IC chip can be provided near the connectable regions.

Moreover, in the embodiment of the invention, a noncontact IC tag can be given, which has the antenna unit, and has the IC chip that is electrically connected to the impedance matching wiring portion and the antenna.

ADVANTAGE OF THE INVENTION

According to the embodiment of the invention, the antenna unit by which the noncontact IC tag having different resonance frequencies can be easily manufactured, and the noncontact IC tag can be provided.

BRIEF DESCRIPTION OF THE DRAWINGS

FIGS. 1A to 1B are explanatory views of appearance of an RFID tag;

FIG. 5 is a table for illustrating change in characteristics of the RFID tag;

FIGS. 7A to 7B are explanatory views of appearance of a noncontact IC tag in the related art.

DESCRIPTION OF THE PREFERRED EMBODIMENT

Hereinafter, an embodiment of the invention will be described in conjunction with drawings.

Figure 2:
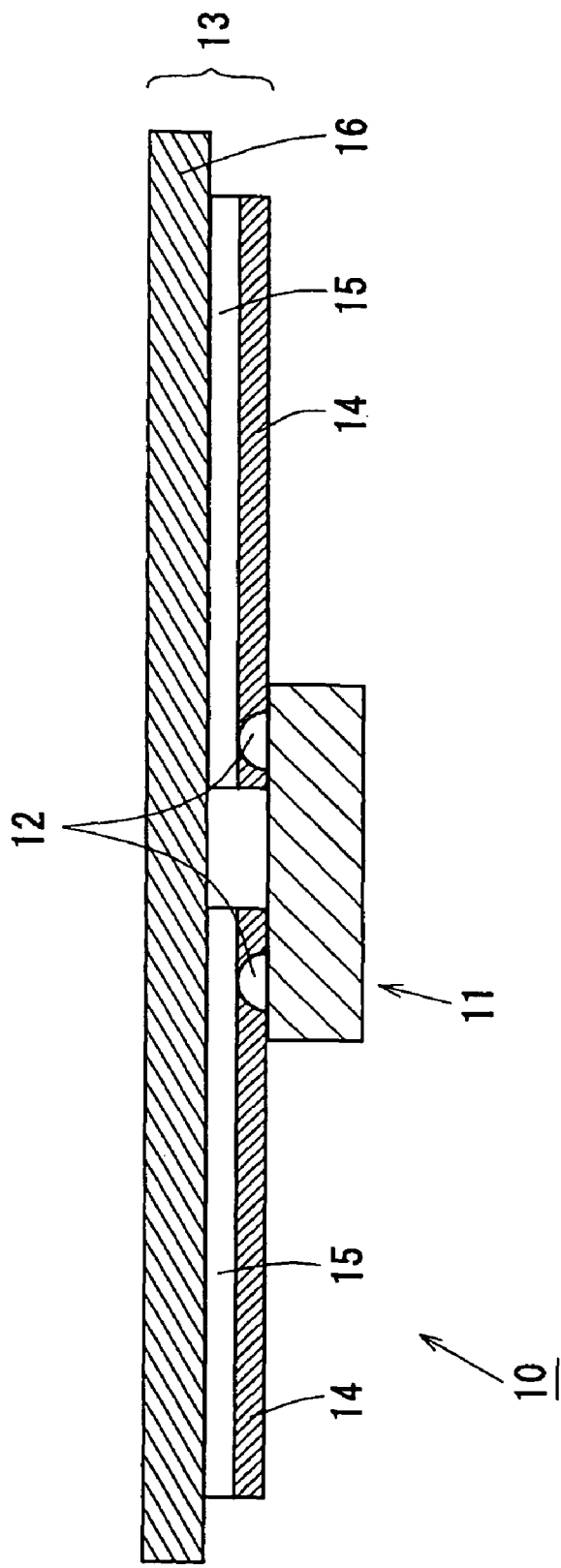
FIG. 2 is a vertically sectional front view of an IC module.

FIG. 1A shows a plane view of an RFID (Radio Frequency Identification) tag 1 using the frequency of the UHF band of 850 to 960 MHz, FIG. 1B shows a front view of the RFID tag 1, and FIG. 2 shows a vertically sectional front view of an IC module 10.

The RFID tag 1 is configured by an antenna circuit board 2 having a rectangular sheet shape, and an IC module 10 having an approximately sheet shape in a small rectangle compared with the antenna circuit board 2.

The antenna circuit board 2 includes a transparent film 3 that is made of PET and has a rectangular shape, and an antenna 4 being slightly smaller than the film 3 is provided on a top of the transparent film 3 by printed wiring. Both of the film 3 and the antenna 4 are sheet members having constant thickness and softness allowing appropriate bendability.

The antenna 4 is a printed circuit having a cutout portion 5 in a substantially T-shape in the center, and the periphery of the cutout portion 5 is formed as an impedance matching wiring portion (impedance matching circuit) 6. In the left and right of the cutout portion 5, connecting regions 8, 8 as projecting portions for connection are provided. The connecting regions 8, 8 are portions to be two ends for electrically connecting the impedance matching wiring portion 6 to an IC chip 11, and are formed bilaterally symmetric and parallel to each other in a vertically long region shown in FIG. 1A. On a top of the antenna 4, an insulating layer omitted to be shown is provided.

A plurality of marker portions 7 arranged in a back and forth direction (vertical direction in FIG. 1A) are provided near the left connecting region 8. While the marker portions 7, 7 are formed by arranging two holes in the back and forth direction in the embodiment, the holes being cut out from the antenna 4 into a long slit shape in a left and right direction, they are not limited to those, and can be formed in an appropriate configuration, such as a configuration of providing more holes, configuration of providing them near the right connecting region 8, or configuration of providing them near the connecting regions 8, 8 in horizontally two sides respectively.

The IC module 10 is configured by the IC chip (semiconductor bare chip) 11 and a strap 13.

The IC chip 11 is a typical IC chip that, for example, has a radio-frequency interface section, control logic section, and storage section within the chip, and operates according to an AC signal, and has a terminal (bump) for combined use of input and output on the top surface as shown in FIG. 2.

In the strap 13, as shown in FIG. 2, conductive wiring portions 15, 15 are arranged in a horizontally divided manner on a bottom of a film 16 that is made of PET and has a rectangular shape, the portions 15, 15 being printed circuits using aluminum, and a bottom of each conductive wiring portion 15 is covered with an insulating layer 14. Each of the insulating layer 14, conductive wiring portion 15, and film 16 is a sheet member having constant thickness and softness allowing appropriate bendability.

The conductive wiring portions 15, 15 arranged with a certain gap are connected with terminals 12, 12 of the IC chip 11 respectively.

Connecting ends 19 (see FIG. 1A) of the IC module 10 formed in this way have width in the back and forth direction (vertical direction in FIG. 1A), the width being formed sufficiently narrow compared with width in the back and forth direction of the connecting regions 8. Accordingly, a position in the connecting regions 8 to which the IC module 10 is connected can be appropriately adjusted.

To explain thickness of respective members, the film 3 is about 32 μm in thickness, antenna 4 is about 18 μm, IC chip 11 is about 100 μm, conductive wiring portion is about 35 μm, and film 16 is about 18 μm.

Size of the RFID tag 1 as a whole, that is, size of the film 3 is about 94 mm (left and right direction) by 16 mm (back and forth direction), and the IC module 10 is mounted on the antenna circuit board 2 such that the IC chip 11 is situated in the center in the left and right direction.

Figure 3:
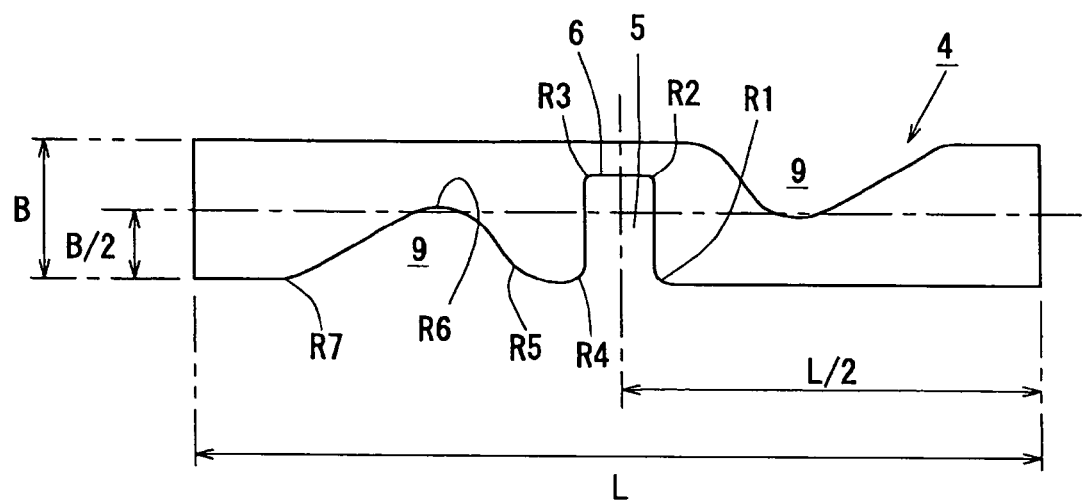
FIG. 3 is a plane view of an antenna in another configuration.

While the antenna 4 was formed in the approximately rectangular shape, it may be formed in a shape as shown in a plane view of FIG. 3. In the antenna 4, length L in the left and right direction is 94 mm, and the IC module 10 is mounted such that the IC chip 11 is situated in a central position of the length L (position 47 mm distant from horizontally two ends) The cutout portion 5, is formed in a reverse U-shape, and in corners of the portion 5, corners R1, R4 are round into a circular arc 2 mm in radius, and corners R2, R3 are round into a circular arc 1 mm in radius.

In horizontally halfway portions of the antenna 4, approximately triangular concave portions 9, 9 are formed symmetrically about a point with respect to a back and forth direction (vertical direction in FIG. 3), and again in corners of the concave portions 9, corners R5, R6 are round into a circular arc 7 mm in radius, and a corner R7 is round into a circular arc 5 mm in radius.

According to a configuration as above, the RFID tag 1 can transmit and receive data through the electromagnetic wave by the antenna 4, and can store the data in a storage section within the IC chip 11.

Next, the mounting positions of the IC module 10 with respect to the connecting regions 8, and difference in characteristics of the RFID tag 1 due to the positions are described.

Figure 4A:
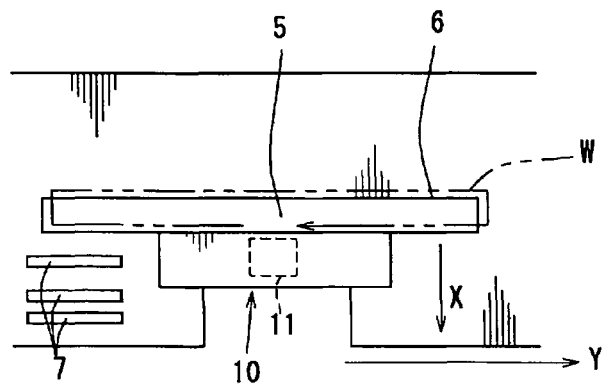
FIGS. 4A to 4C are explanatory views of mounting positions of the IC module.
Figure 4B:
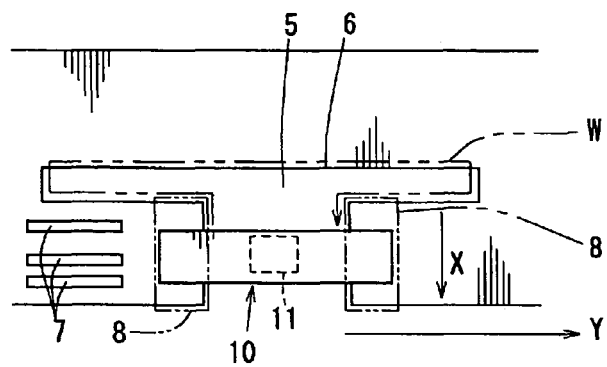
Figure 4C:
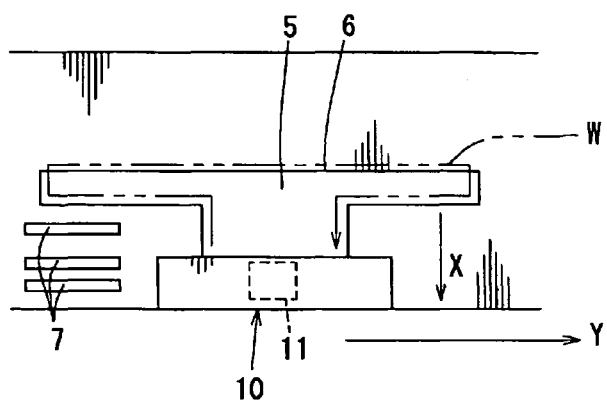

FIGS. 4A to 4C illustrate the mounting positions of the IC module 10 in a case of providing the marker portions 7 in the RFID tag 1 described in conjunction with FIGS. 1 and 2.

FIG. 5 is a table for illustrating change in characteristics in the case that the mounting positions of the IC module 10 is changed as shown in FIGS. 4A to 4C using the antenna 4 shown in conjunction with FIG. 3.

First, as shown in FIG. 4A, when the IC module 10 is connected to a side of the impedance matching wiring portion 6 in an X direction shown in the figure, which is a width direction of the antenna 4, such that effective partial length W (circuit length) for impedance matching of the impedance matching wiring portion 6 is shortest (area of the impedance matching wiring portion 6 is smallest), as shown in a position (A) in FIG. 5, an RFID tag 1 having a characteristic value (impedance value, Gain-M value or the like) of which the corresponding frequency is 953 MHz is obtained. At that time, the IC module 10 points a marker portion 7 nearest to the side of the impedance matching wiring portion 6 among three marker portions 7, consequently it is visible that the frequency corresponds to the marker portion 7.

Next, as shown in FIG. 4B, when the IC module 10 is connected to a position slid (moved in parallel) from the position of FIG. 4A in the X direction shown in the figure, which is the width direction of the antenna 4, such that the effective partial length W of the impedance matching wiring portion 6 is about medium, the position being an about central position of the connecting region 8, as shown in a position (B) in FIG. 5, an RFID tag 1 having a characteristic value (impedance value, Gain-M value or the like) of which the corresponding frequency is 915 MHz is obtained.

Next, as shown in FIG. 4C, when the IC module 10 is connected to a position further slid (moved in parallel) from the position of FIG. 4B in the X direction shown in the figure, which is a width direction of the antenna 4, the position being at a side opposite to the side of the impedance matching wiring portion 6 (both ends of the impedance matching wiring portion 6), such that the effective partial length W of the impedance matching wiring portion 6 is longest (area of the impedance matching wiring portion 6 is largest), as shown in a position (C) in FIG. 5, an RFID tag 1 having a characteristic value (impedance value, Gain-M value or the like) of which the corresponding frequency is 850 MHz is obtained. At that time, the IC module 10 points a marker portion 7 at a position most distant from the impedance matching wiring portion 6 among the three marker portions 7, consequently it is visible that the frequency corresponds to the marker portion 7.

In the embodiment, the position of the IC module 10 is changed only by about several millimeters in the X direction respectively in FIG. 4A, FIG. 4B, and FIG. 4C with connection accuracy of about ±150 μm.

As described hereinbefore, according to the RFID tag 1, even if several types of antennas 4 are not prepared, only by changing the connecting position of the IC module 10 with respect to a single antenna 4, several types of RFID tags 1 having different frequency bands can be manufactured.

Since the connecting regions 8, 8 are parallel, the effective partial length of the impedance matching wiring portion 6 can be easily changed by adjusting the mounting positions of the IC module 10.

Compared with a direction in which the mounting positions of the IC module 10 can be changed, or the X direction in FIG. 4, the antenna 4 is long in the Y direction perpendicular to the X direction, therefore even if the mounting positions of the IC module 10 are changed, length of the antenna 4 is not changed, consequently the number of parameters varied according to change of the mounting positions of the IC module 10 can be decreased. Accordingly, an RFID tag 1 adapted for a specification of each country can be easily manufactured.

Moreover, since the marker portions 7 are formed correspondingly to the connecting positions of the IC module 10, a type (country) to which a manufactured RFID tag 1 corresponds can be easily determined at a glance.

In addition, since the marker portions 7 can be formed by slit-like holes formed in the antenna 4, that is, can be formed by avoiding printing in the relevant portions during forming printed wiring, cost of the RFID tag 1 is not increased, consequently an antenna circuit board 2 and an RFID tag 1, which have high versatility, can be provided at low cost.

While the IC chip 11 was indirectly connected to the antenna 4 and the impedance matching wiring portion 6 via the conductive wiring portion 15, the IC chip 11 may be directly connected to the antenna 4 and the impedance matching wiring portion 6. Again in this case, the connecting position of the IC chip 11 is adjusted, thereby communication frequency of the RFID tag 1 can be changed.

Figure 6A:
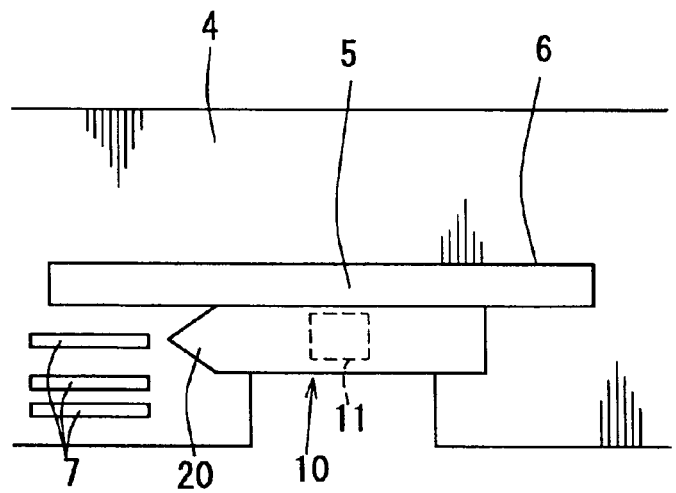
FIGS. 6A to 6B are explanatory views of an RFID tag of another embodiment.
Figure 6B:
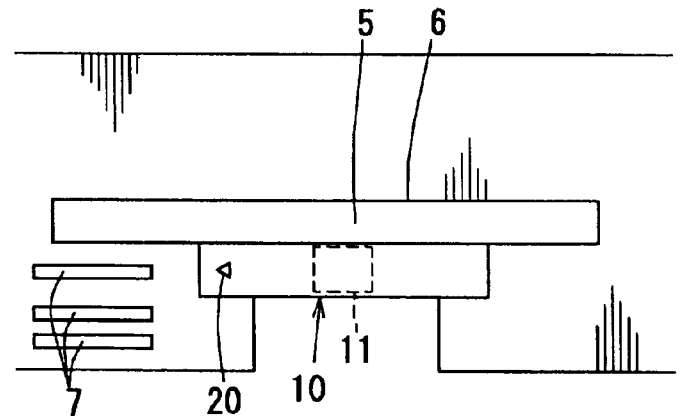

While the strap 13 of the IC module 10 was formed in a rectangular shape, a marker portion 20 may be formed similarly in the strap 13 as shown in FIG. 6A or FIG. 6B. In this case, an end of the IC module 10 is acuminated as shown in FIG. 6A, or a hole is formed therein as shown in FIG. 6B, thereby the marker portion 20 can be formed.

In this case, even if the connecting position of the IC module 10 is changed in a small area, a marker portion 7 pointed by the IC module 10 can be more clearly seen.

In correspondence relationship between a configuration of an embodiment of the invention and the above embodiment, the noncontact IC tag of the embodiment of the invention corresponds to the RFID tag 1 in the above embodiment, and similarly, the antenna unit corresponds to the antenna circuit board 2, the identification portions correspond to the marker portions 7, the connectable regions and the two ends correspond to the connecting regions 8, and the effective partial length of the impedance matching wiring portion corresponds to the effective partial length W, however, the embodiment of the invention is not limited to the configuration of the above embodiment, and may have many embodiments.

What is claimed is:

1. An antenna unit comprising:
   an antenna; and
   an impedance matching wiring portion,
   wherein when an IC chip is electrically connected to the antenna and the impedance matching wiring portion, a noncontact IC tag is formed,
   wherein a plurality of connectable regions are provided in the impedance matching wiring portion for making a direct or indirect connection with the IC chip, and
   wherein a connecting position of the IC chip to the connectable regions is adjustable within a predetermined range by changing the position of the IC chip on the impedance matching wiring portion, so that an effective partial length for impedance matching is made adjustable and so that a different resonance frequency may be achieved when the IC chip is arranged at a different position on the impedance matching wiring portion.

2. The antenna unit according to claim 1:
   wherein the connectable regions are two ends of the impedance matching wiring portion, and the two ends are arranged approximately parallel to each other.

3. The antenna unit according to claim 2:
   wherein the antenna is formed in a shape extending in an approximately perpendicular direction to the two ends parallel to each other.

4. The antenna unit according to claim 3:
   wherein identification portions for identifying difference in performance due to connecting positions of the IC chip are provided near the connectable regions.

5. A noncontact IC tag having the antenna unit according to claim 3:
   wherein an IC chip is electrically connected to the impedance matching wiring portion and the antenna.

6. A noncontact IC tag having the antenna unit according to claim 4:
   wherein an IC chip is electrically connected to the impedance matching wiring portion and the antenna.

7. The antenna unit according to claim 2:
   wherein identification portions for identifying difference in performance due to connecting positions of the IC chip are provided near the connectable regions.

8. A noncontact IC tag having the antenna unit according to claim 7:

wherein an IC chip is electrically connected to the impedance matching wiring portion and the antenna.

9. A noncontact IC tag having the antenna unit according to claim 2:
wherein an IC chip is electrically connected to the impedance matching wiring portion and the antenna.

10. The antenna unit according to claim 1:
wherein identification portions for identifying difference in performance due to connecting positions of the IC chip are provided near the connectable regions.

11. A noncontact IC tag having the antenna unit according to claim 10:
wherein an IC chip is electrically connected to the impedance matching wiring portion and the antenna.

12. A noncontact IC tag having the antenna unit according to claim 1:
wherein an IC chip is electrically connected to the impedance matching wiring portion and the antenna.

\* \* \* \* \*